(12) United States Patent
Park et al.

(10) Patent No.: US 11,627,659 B2
(45) Date of Patent: Apr. 11, 2023

(54) PRINTED CIRCUIT BOARD AND ELECTRONIC PACKAGE COMPRISING THE SAME

(71) Applicant: SAMSUNG ELECTRO-MECHANICS CO., LTD., Suwon-si (KR)

(72) Inventors: Je Sang Park, Suwon-si (KR); Sang Ho Jeong, Suwon-si (KR); Yong Duk Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 25 days.

(21) Appl. No.: 17/239,169

(22) Filed: Apr. 23, 2021

(65) Prior Publication Data

US 2022/0104347 A1 Mar. 31, 2022

(30) Foreign Application Priority Data

Sep. 28, 2020 (KR) .................. 10-2020-0125603

(51) Int. Cl.
*H05K 1/11* (2006.01)
*H05K 1/02* (2006.01)
(Continued)

(52) U.S. Cl.
CPC ....... *H05K 1/0298* (2013.01); *H01L 23/5383* (2013.01); *H01L 25/0652* (2013.01); *H01L 25/0657* (2013.01); *H01L 25/18* (2013.01); *H05K 1/112* (2013.01); *H05K 1/181* (2013.01); *H05K 3/4682* (2013.01); *H01L 2225/06517* (2013.01); *H01L 2225/06548* (2013.01); *H01L 2225/06572* (2013.01); *H05K 2201/0367* (2013.01); *H05K 2201/096* (2013.01);
(Continued)

(58) Field of Classification Search
CPC ......... H05K 1/112; H05K 2201/09827; H05K 2201/10545; H05K 2201/0367; H05K 1/0298
See application file for complete search history.

(56) References Cited

U.S. PATENT DOCUMENTS

2001/0042640 A1* 11/2001 Nakamura ............... H01L 23/13
174/262
2009/0071707 A1* 3/2009 Endo ....................... H05K 3/423
174/266
(Continued)

FOREIGN PATENT DOCUMENTS

KR 10-1799668 B1 11/2017

*Primary Examiner* — Sherman Ng
(74) *Attorney, Agent, or Firm* — Morgan, Lewis & Bockius LLP

(57) ABSTRACT

A printed circuit board includes a first insulating layer; a first wiring layer having at least a portion buried in one surface side of the first insulating layer and having at least a portion of one surface exposed from the one surface of the first insulating layer; a metal post disposed on the exposed one surface of at least the portion of the first wiring layer; and a second wiring layer disposed on the other surface of the first insulating layer. A width of a first surface, connected to the exposed one surface of at least a portion of the first wiring layer, of the metal post, is greater than a width of a second surface of the metal post opposing the first surface.

22 Claims, 7 Drawing Sheets

(51) Int. Cl.
  *H05K 3/46* (2006.01)
  *H05K 1/18* (2006.01)
  *H01L 23/538* (2006.01)
  *H01L 25/18* (2023.01)
  *H01L 25/065* (2023.01)

(52) U.S. Cl.
  CPC .............. *H05K 2201/09827* (2013.01); *H05K 2201/10545* (2013.01)

(56) References Cited

U.S. PATENT DOCUMENTS

| | | | |
|---|---|---|---|
| 2015/0000959 A1* | 1/2015 | Su | H05K 3/4623 29/830 |
| 2015/0382463 A1* | 12/2015 | Kim | H05K 3/4007 29/829 |
| 2016/0268188 A1* | 9/2016 | Kariya | H01L 23/3121 |
| 2016/0315042 A1* | 10/2016 | Yoon | H01L 21/6835 |
| 2017/0213799 A1* | 7/2017 | Inagaki | H01L 21/6835 |
| 2017/0294412 A1 | 10/2017 | Lee et al. | |

* cited by examiner

PRINTED CIRCUIT BOARD AND ELECTRONIC PACKAGE COMPRISING THE SAME

CROSS-REFERENCE TO RELATED APPLICATION(S)

This application claims benefit of priority to Korean Patent Application No. 10-2020-0125603 filed on Sep. 28, 2020 in the Korean Intellectual Property Office, the disclosure of which is incorporated herein by reference in its entirety.

TECHNICAL FIELD

The present disclosure relates to a printed circuit board and an electronic package comprising the same.

BACKGROUND

With the advent of the 5G era, the number of electronic components to be mounted on a main board has increased, such that various types of module structures for reducing an area have been applied. For example, a double-sided system in package (SiP) structure in which electronic components are mounted on both surfaces of a substrate has been used. In the case of such a double-sided SiP, solder balls may be used for bonding a main board with a module, but there has been an increasing interest in using a metal post to decrease a pitch.

SUMMARY

An aspect of the present disclosure is to provide a printed circuit board which may be manufactured by a simple process and in which a height of a metal post may be easily adjusted, and an electronic package comprising the same.

Another aspect of the present disclosure is to provide a printed circuit board in which it is not necessary to form roughness due to desmearing or plasma processing on a surface of an insulating material such as solder resist such that quality risk may decrease, and an electronic package comprising the same.

According to an aspect of the present disclosure, a printed circuit board may be manufactured by preferentially forming a metal post in the form of a deep via using a core layer such as a copper clad laminate (CCL) before a circuit of a printed circuit board is formed, and removing a material of the core layer to expose the metal post after the circuit is formed.

For example, according to an aspect of the present disclosure, a printed circuit board may include a first insulating layer; a first wiring layer having at least a portion buried in one surface side of the first insulating layer and having at least a portion of one surface exposed from the one surface of the first insulating layer; a metal post disposed on the exposed one surface of at least the portion of the first wiring layer; and a second wiring layer disposed on the other surface of the first insulating layer. A width of a first surface, connected to the exposed one surface of at least a portion of the first wiring layer, of the metal post, is greater than a width of a second surface of the metal post opposing the first surface.

For example, according to an aspect of the present disclosure, an electronic component package may include a printed circuit board including a plurality of insulating layers, a plurality of wiring layers, a plurality of wiring via layers, and a metal post, where the metal post is disposed on a lower surface of a lowermost wiring layer of the plurality of wiring layers and has a tapered shape of which a width of an upper surface is greater than a width of a lower surface; a first electronic component mounted on a lower side of the printed circuit board; and a second electronic component mounted on an upper side of the printed circuit board. The first and second electronic components are connected to each other through the printed circuit board.

For example, according to an aspect of the present disclosure, an electronic component package may include a printed circuit board including a first insulating layer, a first wiring layer having at least a portion buried in one surface of the first insulating layer, and having at least a portion of one surface exposed from the one surface of the first insulating layer, a metal post integrated with at least a portion of the first wiring layer and extending directly from the exposed one surface of at least the portion of the first wiring layer, a second wiring layer disposed on the other surface of the first insulating layer, and a wiring via disposed in the first insulating layer, and connecting at least portions of the first and second wiring layers to each other; and a first electronic component mounted to the printed circuit board.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
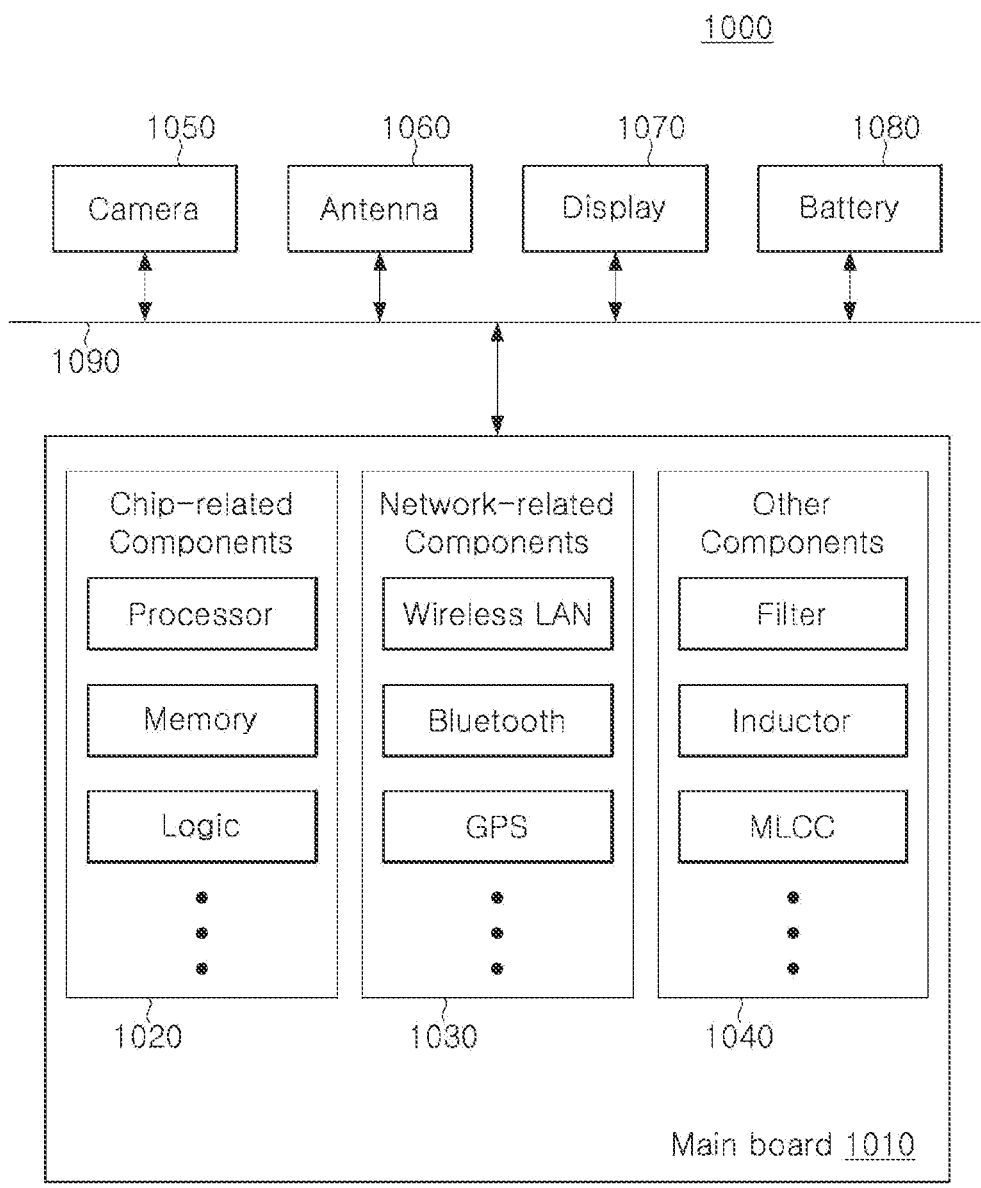
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
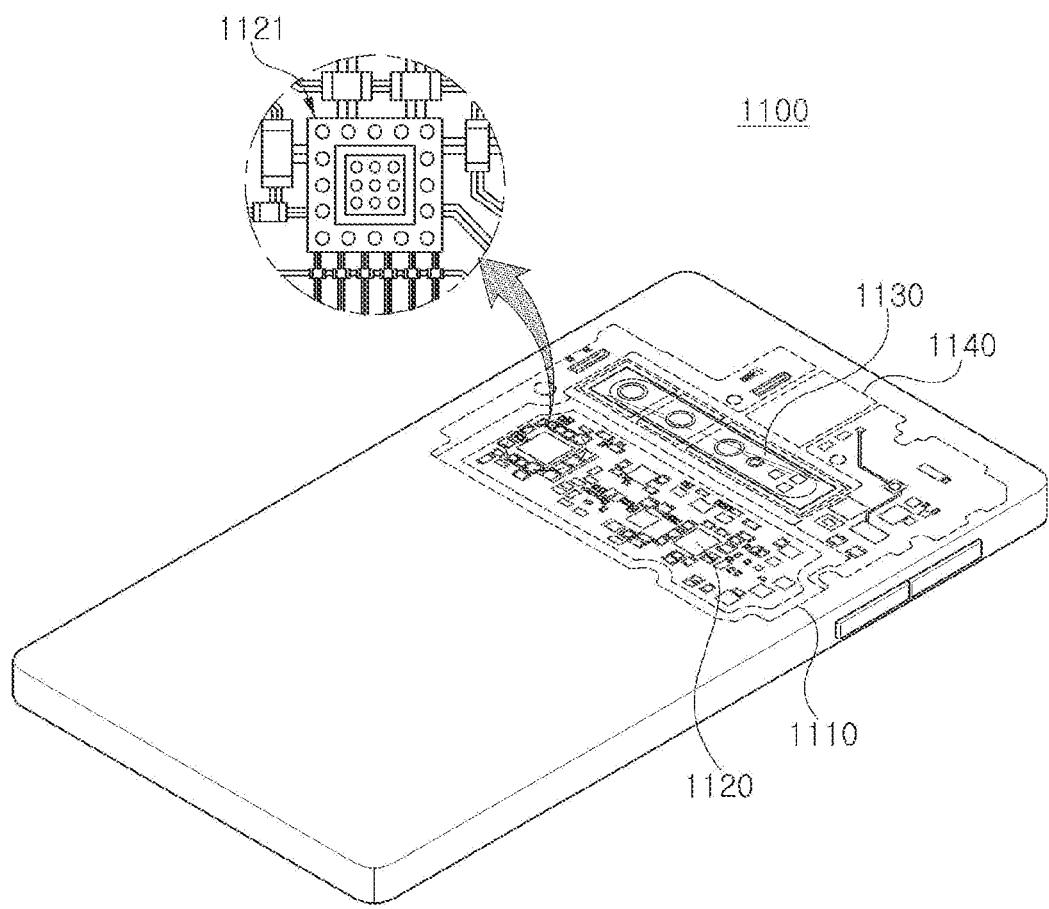
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
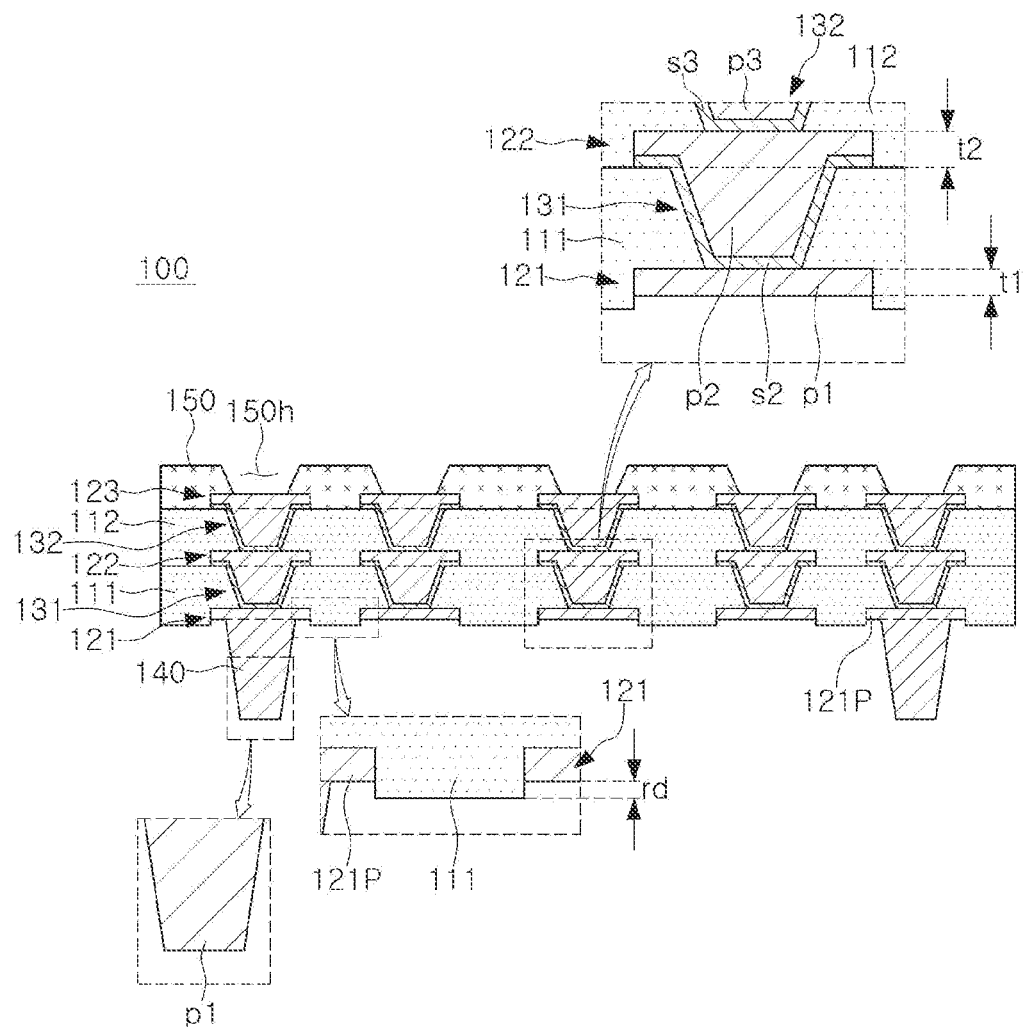
FIG. 3 is a cross-sectional diagram illustrating an example of a printed circuit board.

FIG. 3 is a cross-sectional diagram illustrating an example of a printed circuit board.

Referring to the diagram, the printed circuit board 100 in the example embodiment may include a first insulating layer 111, a first wiring layer 121 having at least a portion buried in a lower surface side of the first insulating layer 111 and having at least a portion of a lower surface exposed from the lower surface of the first insulating layer 111, a second wiring layer 122 disposed on an upper surface of the first insulating layer 111, and a metal post 140 disposed on at least a portion of the first wiring layer 121, an exposed lower surface of a pad pattern 121P. In this case, the metal post 140 may have a tapered shape in which a width of an upper surface connected to the exposed lower surface of the pad pattern 121P, a width of at least a portion of the first wiring layer 121, for example, may be greater than a width of a lower surface opposite to the upper surface.

As a method of forming a metal post, for example, a method of manufacturing a required number of printed circuit boards, forming a seed layer thereon, and selectively plating only the metal post portion using a dry film may be used. When such a metal post is formed on a surface of solder resist, adhesive force may be insufficient, such that an additional process such as a desmearing or plasma processing may be added to form physical roughness. In this case, the surface of an insulating material such as a solder resist may be damaged, such that there may be a potential quality risk during assembly. Also, since only the metal post is selectively plated, the plated area may be narrow such that thickness distribution within a panel may occur. To address the issue, a plating process may be performed several times to form a thickness to be greater than a target thickness and a grinding process may be performed to planarize the height. In this case, several processes may be added to form a metal post, and there may be a potential quality risk such as non-peelability caused by using a thick dry film.

Differently from the above example, the printed circuit board 100 in the example embodiment may be manufactured by preferentially forming a metal post 140 in the form of a deep via using a core layer such as CCL before a circuit of the printed circuit board 100 is formed, and exposing the metal post 140 by removing a material of the core layer after the circuit is formed. Accordingly, the metal post 140 may be disposed on at least a portion of the first wiring layer 121, an embedded pattern of the printed circuit board 100 formed in the form of embedded trace substrate (ETS), that is, for example, the exposed lower surface of the pad pattern 121P, and the metal post 140 may have a tapered shape, a deep via process form. In the case of the printed circuit board 100 configured as above, since the method of forming the metal post 140 is not a plating method using a dry film, the additional processes such as desmearing or plasma processing may be omitted, such that quality risk may be addressed. Also, since the metal post 140 is formed by a deep via process using a core layer such as CCL, the height may be easily adjusted, and thus, quality risks such as dry film non-peel may be addressed.

The exposed bottom surface of the first wiring layer 121 may have a difference from the lower surface of the first insulating layer 111. For example, the exposed bottom surface of the first wiring layer 121 may be recessed into the first insulating layer 111. That is because, as in the process to be described later, when the core layer such as CCL is removed, metal foil such as copper foil used as a seed layer may be removed by etching such that a recess depth may be formed. Similarly, the number of conductor layers s2 and p2 of the second wiring layer 122 may be greater than the number of conductor layers p1 of the first wiring layer 121. That is because, in the case of the first wiring layer 121, metal foil such as copper foil used as a seed layer may be removed by etching as described above. Thus, the second wiring layer 122 may include a plurality of conductor layers s2 and p2 including a seed layer s2, whereas the first wiring layer 121 may include a single conductor layer p1 without a seed layer. Accordingly, a thickness t2 of the second wiring layer 122 may be greater than a thickness t1 of the first wiring layer 121.

The metal post 140 may be integrated with at least a portion of the first wiring layer 121 without a boundary. This is because, as in a process to be described later, when the first wiring layer 121 is formed on a core layer such as CCL, the metal posts 140 may be formed together in the same plating process. Therefore, bonding reliability between the first wiring layer 121 and the metal post 140 may improve. Accordingly, the metal post 140 may also include a single conductor layer p1 without a seed layer, similarly to the first wiring layer 121.

The printed circuit board 100 in the example embodiment may further include a first wiring via layer 131. The first wiring via layer 131 and the first and second wiring layers 121 and 122 may be connected to each other through a first wiring via layer 131 penetrating through the first insulating layer 111. The first wiring via layer 131 may be formed together by the same plating process of forming the second wiring layer 122. Accordingly, the first wiring via layer 131 may be integrated with the second wiring layer 122 without a boundary. Also, the first wiring via layer 131 may also include a plurality of conductor layers s2 and p2 including the seed layer s2.

The printed circuit board 100 in the example embodiment may further include a second insulating layer 112, a third wiring layer 123, and a second wiring via layer 132. The second insulating layer 112 may be disposed on the upper surface of the first insulating layer 111, and at least a portion of the second wiring layer 122 may be buried in the lower surface side. The third wiring layer 123 may be disposed on the upper surface of the second insulating layer 112. The second and third wiring layers 122 and 123 may be connected to each other through a second wiring via layer 132 penetrating through the second insulating layer 112. The third wiring layer 123 may include a plurality of conductor layers s3 and p3 including a seed layer s3. The second wiring via layer 132 may be formed together by the same plating process of forming the third wiring layer 123. Accordingly, the second wiring via layer 133 may be integrated with the third wiring layer 123 without a boundary. Also, the second wiring via layer 132 may also include a plurality of conductor layers s3 and p3 including a seed layer s3.

The printed circuit board 100 in the example embodiment may be disposed on the upper surface of the second insulating layer 112, and may further include a passivation layer 150 having a plurality of openings 150h each exposing at least a portion of the third wiring layer 123. The passivation layer 150 may protect internal components of the printed circuit board 100 from external physical and chemical elements. When the printed circuit board 100 include a greater number of layers, the passivation layer 150 may be disposed on the insulating layer disposed further above the second insulating layer 112 and may have an opening exposing at least a portion of a wiring layer disposed further above the third wiring layer 123.

In the description below, the elements of the printed circuit board 100 will be described with reference to the drawings.

An insulating material may be used as a material of the first and second insulating layers 111 and 112, and as the insulating material, a thermosetting resin such as epoxy resin or a thermoplastic resin such as polyimide, and the above-mentioned resin including inorganic fillers such as silica and/or reinforcing materials such as glass fibers may be used. For example, as a material of the first and second insulating layers 111 and 112, prepreg (PPG), an Ajinomoto build-up film (ABF), or the like, may be used. The thicknesses of the first and second insulating layers 111 and 112 may be substantially the same, but an example embodiment thereof is not limited thereto.

A metal material may be used as a material for the first to third wiring layers 121, 122, and 123, and as a metal material, copper (Cu), aluminum (Al), silver (Ag), tin (Sn), gold (Au), nickel (Ni), lead (Pb), titanium (Ti), or an alloy thereof may be used. Each of the first to third wiring layers 121, 122, and 123 may perform various functions according to a design. For example, the first to third wiring layers 121, 122, and 123 may include a ground pattern, a power pattern, a signal pattern, and the like. The signal pattern may include various signals other than the ground pattern and the power pattern, such as a data signal, for example. Each of these patterns may have a shape of line, a shape of plane, or a pad shape. Each of the first to third wiring layers 121, 122, and 123 may be formed by a plating process such as an additive process (AP), a semi-AP (SAP) process, a modified SAP (MSAP) process, a tenting (TT) process, or the like. The first wiring layer 121 may include an electrolytic plating layer p1 without a seed layer. The second and third wiring layers 122 and 123 may each include seed layers s2 and s3, which are electroless plating layers, and electroplating layers p2 and p3 formed on the basis of the seed layers s2 and s3, respectively. At least one of the second and third wiring layers 122 and 123 may further include a primer copper foil.

A metal material may be used as a material for the first and second wiring via layers 131 and 132, and as a metal material, copper (Cu), aluminum (Al), silver (Ag), tin (Sn), gold (Au), nickel (Ni), lead (Pb), titanium (Ti), or an alloy thereof may be used. Each of the first and second wiring via layers 131 and 132 may include a signal connection via, a ground connection via, and a power connection via according to a design. A wiring via of each of the first and second wiring via layers 131 and 132 may be completely filled with a metal material, or a metal material may be formed along a wall surface of the via hole. The first and second wiring via layers 131 and 132 may have a tapered shape, tapered in the same direction. The first and second wiring via layers 131 and 132 may be formed by a plating process, such as AP, SAP, MSAP, TT, or the like, for example, and may thus include the seed layers s2 and s3, which are electroless plating layers, and electroplating layers p2 and p3 formed on the basis of the seed layers s2 and s3.

A metal material may be used as a material for the metal post 140, and as a metal material, copper (Cu), aluminum (Al), silver (Ag), tin (Sn), gold (Au), nickel (Ni), lead (Pb), titanium (Ti), or an alloy thereof may be used. A plurality of the metal posts 140 may be arranged, and each may be a signal metal post, a ground metal post, a power metal post, or the like, according to a design. The metal post 140 may be completely filled with a metal material. The metal post 140 may have a tapered shape tapered in the same direction as those of the first and second wiring via layers 131 and 132. The metal post 140 may also be formed by a plating process, for example, AP, SAP, MSAP, TT, or the like. The metal post 140 may include an electroplating layer p1 without a seed layer.

An insulating material may be used as a material of the passivation layer 150. As the insulating material, a thermosetting resin such as an epoxy resin, a thermoplastic resin such as polyimide, or a material in which these resins are mixed with an inorganic filler, such as an ABF, for example, may be used, but an example embodiment thereof is not limited thereto. For example, the passivation layer 150 may be solder resist (SR) including a photosensitive insulating material.

FIGS. 4 to 11 are diagrams illustrating an example of processes of manufacturing the printed circuit board illustrated in FIG. 3.

Figure 4:
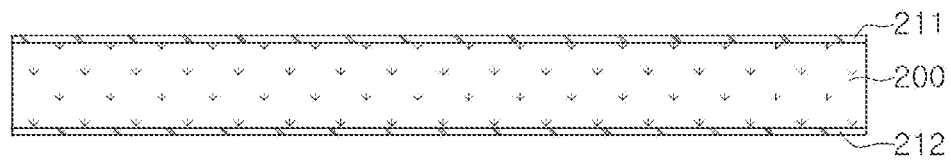
FIGS. 4 to 11 are diagrams illustrating an example of processes of manufacturing the printed circuit board illustrated in FIG. 3.

Referring to FIG. 4, a core layer such as CCL in which the first and second copper foils 211 and 212 are laminated on the upper and lower surfaces of the insulating material 200 may be prepared.

Figure 5:
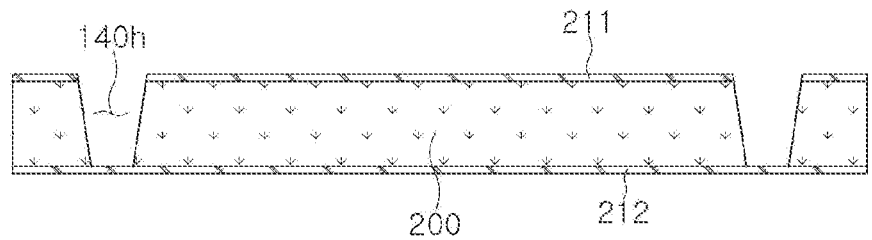

Referring to FIG. 5, thereafter, a deep via hole 140h may be processed in the core layer using a laser drill or a mechanical drill.

Figure 6:
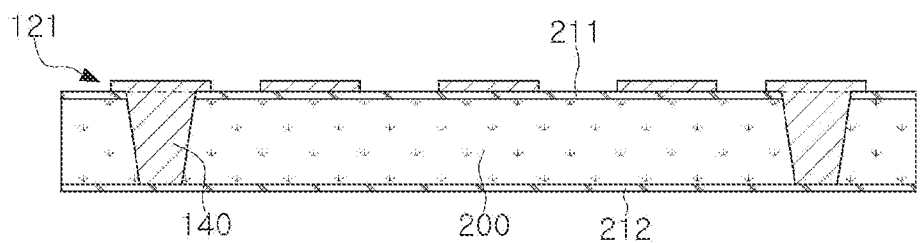

Referring to FIG. 6, the first wiring layer 121 may be formed on the first copper foil 211 by a plating process, and deep via hole 140h may be filled at the same time, thereby forming the metal post 140.

Figure 7:
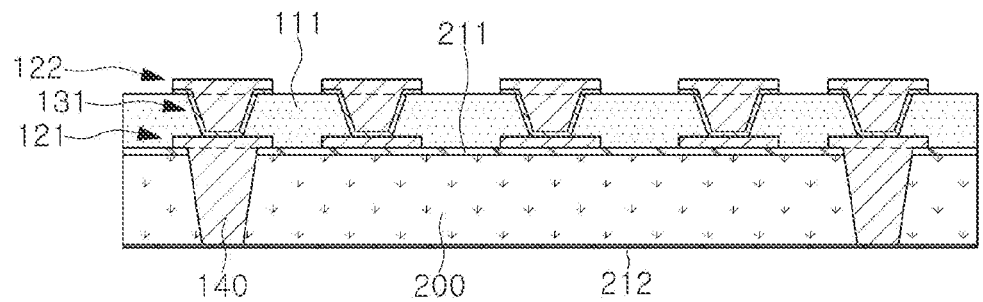

Referring to FIG. 7, thereafter, a first insulating layer 111 covering the first wiring layer 121 may be formed on the first copper foil 211, and a via hole may be formed by a laser drill, and the second wiring layer 122 and the first wiring via layer 131 may be formed by a plating process. A portion of the second copper foil 212 may be removed during a process of etching a seed layer.

Figure 8:
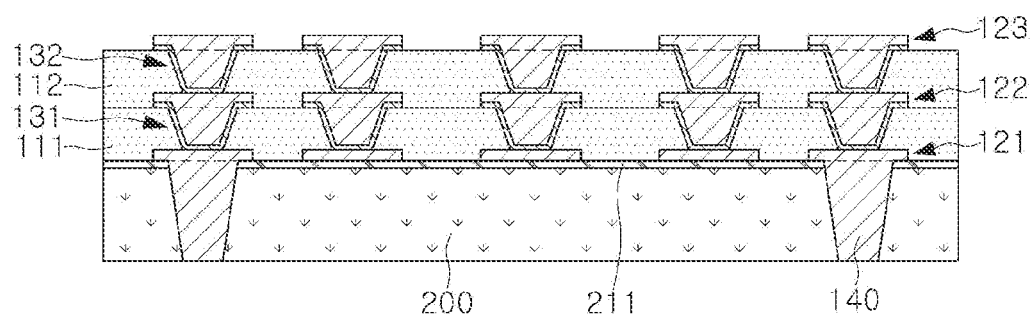

Referring to FIG. 8, a second insulating layer 112 covering the second wiring layer 122 may be formed on the first insulating layer 111, a via hole may be formed by a laser drill, and the third wiring layer 123 and the second wiring via layer 132 may be formed by a plating process. The other portion of the copper foil 212 may be removed in a process of etching the seed layer.

Figure 9:
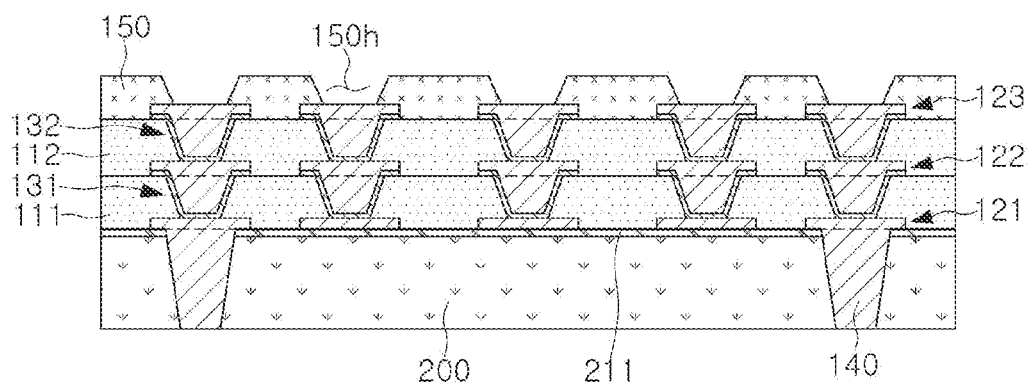

Referring to FIG. 9, a passivation layer 150 covering the third wiring layer 123 may be formed on the second insulating layer 112, and a plurality of openings 150h each exposing at least a portion of the three wiring layer 123 may be formed in the passivation layer 150.

Figure 10:
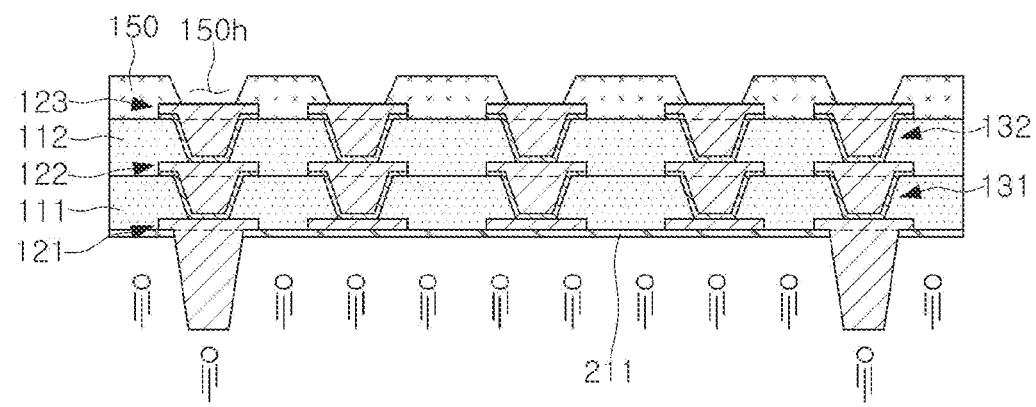

Referring to FIG. 10, the insulating material 200 may be removed by a blasting process. In this case, the first copper foil 211 may function as a stopper.

Figure 11:
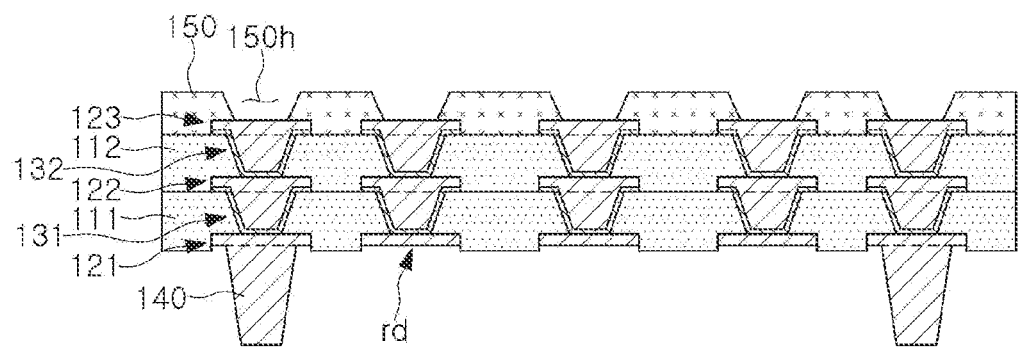

Referring to FIG. 11, the first copper foil 211 may be removed by an etching process. In this case, a portion of the first wiring layer 121 may be removed to form a recess depth rd.

The printed circuit board 100 of the aforementioned example embodiment may be manufactured through a series of processes, and overlapping descriptions will not be repeated.

Figure 12:
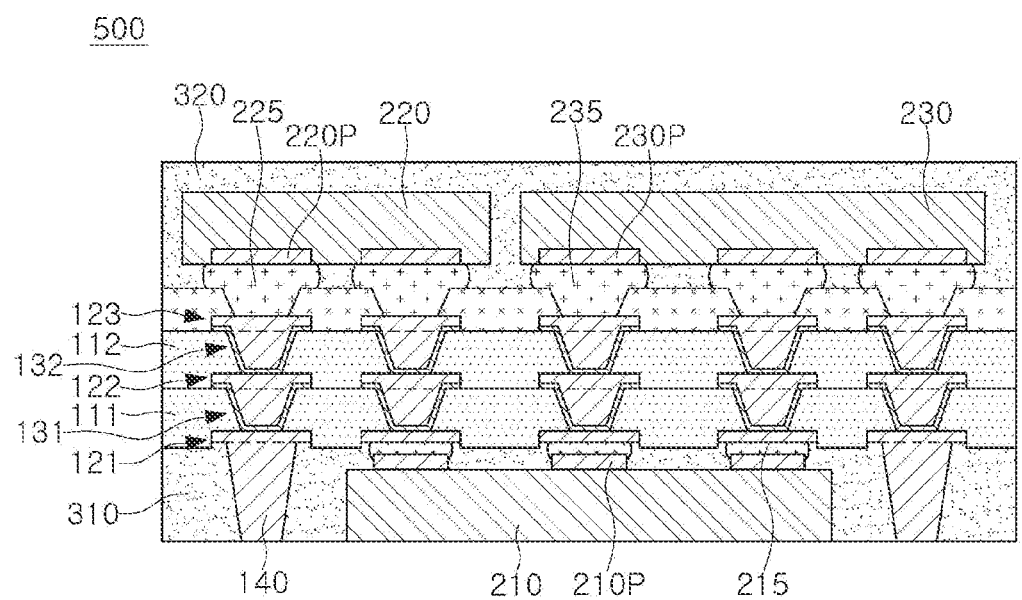
FIG. 12 is a cross-sectional diagram illustrating an example of an electronic component package.

FIG. 12 is a cross-sectional diagram illustrating an example of an electronic component package.

Referring to the diagram, in an electronic component package 500, a first electronic component 210 may be mounted on a lower side of the printed circuit board 100, and second and third electronic components 220 and 230 may be mounted on an upper side of the printed circuit board 100. The first electronic component 210 may overlap at least a portion of each of the second and third electronic components 220 and 230 on a plane. In one example, the plane may refer to a plane parallel to, for example, an upper surface or a lower surface of the electronic component package in a stacking direction of wiring layers of the printed circuit board 100. The first to third electronic components 210, 220 and 230 may have a plurality of first to third electrode pads 210P, 220P, and 230P, respectively, and may be disposed on the printed circuit board 100 in the form of surface mounting through the plurality of first to third connection members 215, 225, and 235. The first to third electronic components 210, 220, and 230 may be electrically connected to each other through the printed circuit board 100. A plurality of the metal posts 140 may be arranged, and the plurality of metal posts 140 may be disposed around the first electronic component 210 below the printed circuit board 100. A first molding material 310 covering at least a portion of each of the metal posts 140 and the first electronic component 210 may be further disposed below the printed circuit board 100. The first molding material 310 may expose a lower surface of the metal post 140 and a rear surface of the first electronic component 210. A second molding material 320 covering at least a portion of each of the second and third electronic components 220 and 230 may be further disposed on an upper side of the printed circuit board 100. The second molding material 320 may bury the second and third electronic components 220 and 230. If necessary, a thin metal plating layer may be further formed on external surfaces of the first and second molding materials 310 and 320 for electromagnetic shielding and/or heat dissipation.

Each of the first to third electronic components 210, 220, and 230 may be an integrated circuit (IC) in which hundreds to millions of devices are integrated into one chip. For example, the first to third electronic components 210, 220, and 230 may be implemented by a processor chip such as a central processor (e.g., CPU), a graphic processor (e.g., GPU), a field programmable gate array (FPGA), a digital signal processor, an encryption processor, a microprocessor, and a microcontroller, an application processor (AP), for example, but an example embodiment thereof is not limited thereto, and may be implemented by a memory such as a volatile memory (e.g., DRAM), a non-volatile memory (e.g., ROM), a flash memory, or the like, or an analog-to-digital converter, or a logic such as an application-specific IC (ASIC). Each of the plurality of first to third electrode pads 210P, 220P, and 230P may include a metal material such as copper (Cu) or aluminum (Al). At least one of the first to third electronic components 210, 220, and 230 may be a chip-shaped passive component, a chip-shaped inductor or a chip-shaped capacitor, for example.

Each of the plurality of first to third connecting members 215, 225, and 235 may include a low melting point metal. For example, the plurality of first to third connection members 215, 225, and 235 may be formed of tin (Sn) or an alloy containing tin (Sn), such as solder, for example. However, an example embodiment thereof is not limited thereto. Each of the plurality of first to third connecting members 215, 225,

235 may be a land, a ball, a pin, and the like, and may have a ball shape, but an example embodiment thereof are limited thereto.

The first and second molding materials 310 and 320 may include an insulating material. As the insulating material, a thermosetting resin such as epoxy resin or a thermoplastic resin such as polyimide, and the above-mentioned resin including inorganic fillers such as silica may be used. For example, the first and second molding materials 310 and 320 may include ABF. However, an example embodiment thereof is not limited thereto, and the first and second molding materials 310 and 320 may be a general epoxy molding compound (EMC) or a photoimageable encapsulant (PIE).

According to the aforementioned example embodiments, a printed circuit board which may be manufactured by a simple process and in which a height of a metal post may be easily adjusted, and an electronic package comprising the same may be provided.

Also, a printed circuit board in which it is not necessary to form roughness through a process such as desmearing or plasma processing on a surface of an insulating material such as solder resist such that quality risk may decrease, and an electronic package comprising the same may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been shown and described above, it will be apparent to those skilled in the art that modifications and variations could be made without departing from the scope of the present invention as defined by the appended claims.

What is claimed is:

1. A printed circuit board, comprising:
   a first insulating layer;
   a first wiring layer having at least a portion buried in one surface of the first insulating layer and having at least a portion of one surface exposed from the one surface of the first insulating layer;
   a metal post disposed on the exposed one surface of at least the portion of the first wiring layer; and
   a second wiring layer disposed on the other surface of the first insulating layer,
   wherein a width of a first surface, connected to the exposed one surface of at least the portion of the first wiring layer, of the metal post, is greater than a width of a second surface of the metal post opposing the first surface, and
   the exposed one surface of the first wiring layer and the one surface of the first insulating layer have a step difference.

2. The printed circuit board of claim 1, wherein the exposed one surface of the first wiring layer is recessed into the first insulating layer with respect to the one surface of the first insulating layer.

3. The printed circuit board of claim 1, wherein the number of conductor layers of the second wiring layer is greater than the number of conductor layers of the first wiring layer.

4. A printed circuit board, comprising:
   a first insulating layer;
   a first wiring layer having at least a portion buried in one surface of the first insulating layer and having at least a portion of one surface exposed from the one surface of the first insulating layer;
   a metal post disposed on the exposed one surface of at least the portion of the first wiring layer; and
   a second wiring layer disposed on the other surface of the first insulating layer,
   wherein a width of a first surface, connected to the exposed one surface of at least the portion of the first wiring layer, of the metal post, is greater than a width of a second surface of the metal post opposing the first surface, and
   the second wiring layer has a thickness greater than a thickness of the first wiring layer.

5. The printed circuit board of claim 4,
   wherein the first wiring layer includes a single conductor layer without a seed layer, and
   wherein the second wiring layer includes a plurality of conductor layers including a seed layer.

6. The printed circuit board of claim 5, wherein the metal post is integrated with at least a portion of the first wiring layer without a boundary therebetween.

7. The printed circuit board of claim 1, wherein the metal post includes a single conductor layer without a seed layer.

8. The printed circuit board of claim 5, further comprising:
   a first wiring via layer penetrating the first insulating layer and connecting at least portions of the first and second wiring layers to each other, wherein the first wiring via layer is integrated with the second wiring layer without a boundary therebetween, and wherein the first wiring via layer includes a plurality of conductor layers including a seed layer.

9. The printed circuit board of claim 1, further comprising:
a second insulating layer disposed on the other surface of the first insulating layer, at least a portion of the second wiring layer buried in one surface of the second insulating layer; and
a third wiring layer disposed on the other surface of the second insulating layer.

10. The printed circuit board of claim 9, further comprising:
a second wiring via layer penetrating the second insulating layer and connecting at least portions of the second and third wiring layers to each other,
wherein the third wiring layer is integrated with the second wiring via layer without a boundary therebetween, and
wherein each of the third wiring layer and the second wiring via layer includes a plurality of conductor layers including a seed layer.

11. The printed circuit board of claim 9, further comprising:
a passivation layer disposed on the other surface of the second insulating layer and having a plurality of openings each exposing at least a portion of the third wiring layer.

12. The printed circuit board of claim 1, further comprising a wiring via disposed in the first insulating layer and connecting the first wiring layer and the second wiring layer to each other,
wherein the wiring via and the metal post are tapered in a same direction.

13. An electronic component package, comprising:
a printed circuit board including a plurality of insulating layers, a plurality of wiring layers, a plurality of wiring via layers, and a metal post, where the metal post is disposed on a lower surface of a lowermost wiring layer of the plurality of wiring layers and has a tapered shape of which a width of an upper surface is greater than a width of a lower surface;
a first electronic component mounted on a lower side of the printed circuit board;
a second electronic component mounted on an upper side of the printed circuit board;
a first molding material disposed on the lower side of the printed circuit board and covering at least a portion of each of the metal post and the first electronic component; and
a second molding material disposed on the upper side of the printed circuit board and covering at least a portion of the second electronic component,
wherein the first and second electronic components are connected to each other through the printed circuit board.

14. The electronic component package of claim 13, wherein at least portions of the first and second electronic components overlap each other on a plane.

15. The electronic component package of claim 13,
wherein the printed circuit board includes a plurality of the metal posts, and
wherein the plurality of metal posts are disposed around the first electronic component.

16. The electronic component package of claim 13, wherein a wiring via of the plurality of wiring via layers and the metal post are tapered in a same direction.

17. An electronic component package, comprising:
a printed circuit board comprising:
a first insulating layer,
a first wiring layer having at least a portion buried in one surface of the first insulating layer, and having at least a portion of one surface exposed from the one surface of the first insulating layer,
a metal post integrated with at least a portion of the first wiring layer and extending directly from the exposed one surface of at least the portion of the first wiring layer,
a second wiring layer disposed on the other surface of the first insulating layer, and
a wiring via disposed in the first insulating layer, and connecting at least portions of the first and second wiring layers to each other; and
a first electronic component mounted to the printed circuit board,
wherein the exposed one surface of the first wiring layer and the one surface of the first insulating layer have a step difference.

18. The electronic component package of claim 17, wherein the exposed one surface of the first wiring layer is recessed into the first insulating layer.

19. The electronic component package of claim 17, wherein the wiring via includes a seed layer in contact with the first wiring layer with respect to the one surface of the first insulating layer.

20. The electronic component package of claim 17, wherein among the exposed one surface of the first wiring layer connected to the metal post and another surface of the first wiring layer connected to the wiring via, only the another surface of the first wiring layer connected to the wiring via is in contact with a seed layer.

21. The electronic component package of claim 17, wherein the first electronic component is connected to the first wiring layer and is disposed on a same side of the printed circuit board with respect to the metal post, and
the electronic component package of further comprises a second electronic component disposed an opposite side of the printed circuit board with respect to the metal post and connected to the first electronic component.

22. The electronic component package of claim 21, further comprising a molding material disposed covering at least a portion of each of the metal post and the first electronic component,
wherein each of the metal post and the first electronic component includes a portion exposed from the molding material.

* * * * *